United States Patent [19]
Monk et al.

[11] Patent Number: 5,414,347
[45] Date of Patent: May 9, 1995

[54] METHOD AND APPARATUS FOR MISSILE INTERFACE TESTING

[75] Inventors: Ronald W. Monk; David P. Van Cleve; Joseph A. Crisafulli; Robert J. Curry; Dennis G. Carpenter; Gerald T. Emmert; David L. Fowler; David A. Milani, all of Tucson, Ariz.

[73] Assignee: Hughes Aircraft Company, Los Angeles, Calif.

[21] Appl. No.: 272,441

[22] Filed: Jul. 8, 1994

Related U.S. Application Data

[63] Continuation of Ser. No. 912,442, Jul. 13, 1992, abandoned.

[51] Int. Cl.$^6$ .............................................. G01R 1/04
[52] U.S. Cl. ................................................. 324/73.1
[58] Field of Search ............................ 324/750–762; 89/1.56-1.819

[56] References Cited

U.S. PATENT DOCUMENTS 4,825,151  4/1989  Aspelin ........................... 324/158 R

FOREIGN PATENT DOCUMENTS 0309133  3/1989  European Pat. Off. .
0387438  9/1990  European Pat. Off. .
2639123  5/1990  France .
2003301  3/1979  United Kingdom .

Primary Examiner—Kenneth A. Wieder
Assistant Examiner—Barry C. Bowser
Attorney, Agent, or Firm—Charles D. Brown; Randall M. Heald; Wanda K. Denson-Low

[57] ABSTRACT

An apparatus (10) for testing an operational status of a missile interface system includes a portable control unit (16) having an interface panel (28). The interface panel (28) has a plurality of umbilical ports adapted to receive data from a plurality of missile stations (12) via a corresponding plurality of umbilical cables (18). The interface panel (28) is further includes a coaxial port (40), adapted to receive data from a radar trap (22) via a coaxial cable (20). The apparatus further includes a fixture assembly (116) having a main body portion (120). The main body portion (120) has a channel (122) through which a first end of the umbilical cable (18) is allowed to pass. The fixture assembly (116) is adapted to be releasably mounted to a missile station (12).

12 Claims, 8 Drawing Sheets

METHOD AND APPARATUS FOR MISSILE INTERFACE TESTING

This is a continuation of Ser. No. 07/912,442, filed Jul. 13, 1992, now abandoned.

BACKGROUND OF THE INVENTION

1. Technical Field

The present invention relates generally to aircraft missile systems, and more particularly to a method and apparatus for simulating and evaluating the operational status of a missile interface system.

2. Discussion

Military aircraft are typically designed to be equipped with a plurality of deployable missiles, such as advanced medium range air to air missiles (hereinafter referred to as AMRAAMS). A missile and its corresponding missile launcher, either a rail launcher or an eject launcher, combine to form a missile station. Within such a military aircraft resides a computer which is responsive to pilot commands and communicates with each missile station to monitor status, perform launch preparation, and execute launch commands. A missile interface system receives commands from the computer and translates these commands to provide data used to monitor or control the missile stations. A typical on-board missile interface includes an umbilical interface and a data link interface. The umbilical interface serves to communicate with the missiles prior to launch separation, while the data link interface communicates with the missiles subsequent to separation.

Once a military aircraft is armed with a plurality of missiles, it is necessary to fully test (e.g., simulate and evaluate) the communications between the aircraft and each missile, both immediately before and immediately after deployment of each missile. In addition, missile interface tests need to be conducted during new aircraft development and/or manufacture, and after any maintenance on operational aircraft. That is, it is necessary to verify the proper functioning of the umbilical and data link interfaces. Test equipment which is used to conduct missile interface simulation and evaluation is designed to test the operational status of the missile interface system in order to verify that all components are in working order and that all connections are sound.

Heretofore, various systems have been employed for missile interface testing. These systems typically include devices which simulate the operational status monitoring and command signals provided to the aircraft computer during mission performance. These test instruments, for example, provide simulated signals to the missile interface and monitor its response to verify the integrity of various internal components of the missile interface. These prior systems have traditionally been large items requiring a computer to control them. Often, such systems are required to be housed in a building and necessitate transporting the aircraft to the building to conduct the necessary testing.

While such systems have proven successful, they are not without their drawbacks. For example, military aircraft having missile interfaces requiring testing are often located in areas near the fronts of a military conflict. In such areas, permanent buildings and reliable power sources are usually unavailable. Thus, most prior systems are not operable out in the field.

A particular system previously employed for simulating and evaluating the operational status of a missile system interface includes a first unit, Hughes Aircraft Company's "Aircraft Software Support Missile Simulator" (hereinafter referred to as ASSMS), and a second unit, Hughes Aircraft Company's "Message Monitor Unit" (hereinafter referred to as MMU). Pre-launch simulation and evaluation is conducted with ASSMS, while post-launch simulation and evaluation is conducted with MMU.

While prior art techniques for testing missile system interfaces have generally proven effective, they also inherently have several disadvantages. For example, current equipment such as ASSMS and the MMU, while being a significant advance in the field, has only limited simulation and evaluation capabilities. ASSMS provides pre-launch simulation and evaluation from launch initiation to missile separation. MMU provides simulation and evaluation of post-launch data linking. When used together, ASSMS and MMU are capable of simulating and evaluating only one complete launch cycle. Other drawbacks inherent in such systems include the tremendous size and the difficulty of operation and data analysis, which is unacceptable in areas near the fronts of military conflict where time is of the essence.

SUMMARY OF THE INVENTION

These and other drawbacks of the prior art are overcome by the present invention which provides an apparatus for testing an operational status of a missile interface which comprises a portable control unit including a microcomputer and an interface panel adapted to receive data from a plurality of missile stations. To this end, the interface panel of the present invention includes a plurality of umbilical ports.

The apparatus of the present invention further includes a plurality of umbilical cables having a first end and a second end. Each first end is adapted to be releasably attached to a port of the interface panel. Each second end is adapted to be releasably attached to an electrical connector disposed on a missile station.

The apparatus of the present invention additionally preferably includes a fixture assembly. The fixture assembly includes a bore through which the second end of the umbilical cable is allowed to pass, and an upper portion adapted to be releasably retained on a rail launcher.

The disadvantages associated with the prior art are further overcome by the method of the present invention which provides a method of testing an operational status of a missile interface system. The method of the present invention comprises transporting a portable control unit to the aircraft to be tested. The control unit has an interface panel including a plurality of ports, and providing at least one cable having a first and second end and being adapted to electrically communicate the interface panel with one of a plurality of missile stations. The method of the present invention further comprises attaching the first end of each cable to the interface panel and attaching the second end of each cable to one of the missile stations.

BRIEF DESCRIPTION OF THE DRAWINGS

Various advantages of the present invention will become apparent to one skilled in the art upon reading the following specification and by reference to the following drawings, in which.

DETAILED DESCRIPTION OF THE PREFERRED EMBODIMENT

While the present invention is illustrated throughout the Figures with reference to a particular embodiment, it will be appreciated that the particular embodiment is merely exemplary.

Figure 1:
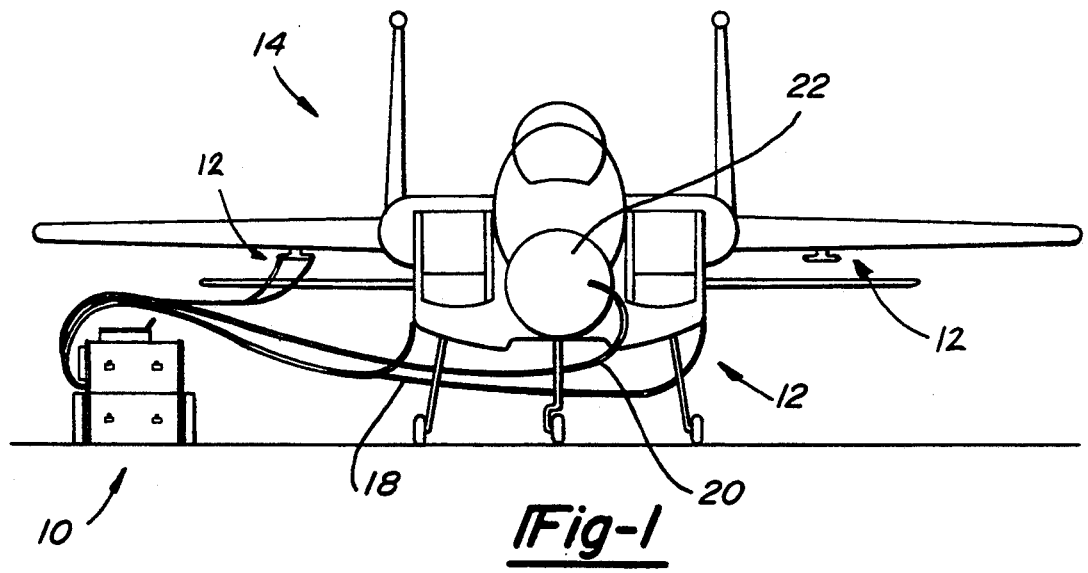
FIG. 1 is a diagrammatical representation of the apparatus for simulating and evaluating the operation status of a missile system interface according to the preferred embodiment of the present invention, as shown in operative connection with a plurality of missile stations of an aircraft.

Turning to FIG. 1, illustrated is the apparatus 10 of the present invention in operative association with a plurality of missile stations 12 on a military aircraft 14.

Figure 2:
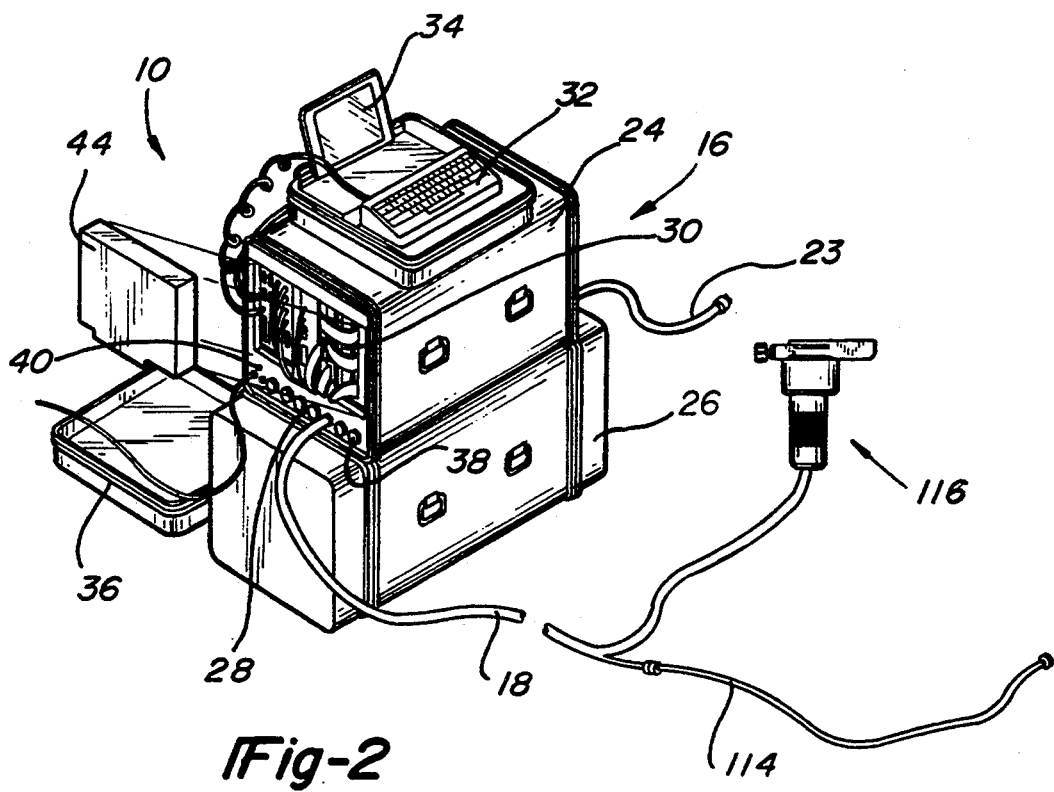
FIG. 2 is a perspective view of the apparatus of FIG. 1.

Referring additionally to FIG. 2, the apparatus 10 of the present invention comprises a portable control unit 16 adapted to receive, transmit and process all data necessary to simulate and evaluate, i.e. test the operational status of a missile interface system pursuant to Hughes classified specification DS32050-682C Rev. C. The apparatus of the present invention further includes umbilical cabling 18 to electrically communicate the missile stations 12 of the aircraft 14 with the control unit 16, and a coaxial line 20 to electrically communicate the control unit 16 with the aircraft radar trap 22 for pickoff of the data link radio frequency (hereinafter "RF") signal.

The control unit 16 is designed to operate on power provided from a conventional portable power cart (not shown). To this end, the control unit further comprises a power cord 23. Thus, the apparatus 10 of the present invention is fully operable out in the field.

The portable control unit 16 of the present invention is shown to include first and second transportation containers 24,26. The weight of the first transportation container 24 is designed to be approximately 160 lbs. To provide means for simultaneously communicating the control unit 16 with a plurality of missile stations 12 and an aircraft radar trap 22, the first container 24 includes an interface panel 28.

The first container 24 additionally includes a VXI mainframe 30. In the preferred embodiment, the first container 24 further includes a storage area (not shown) adapted to store one umbilical cable 18. The second transportation container 26 serves to store the remaining umbilical cables 18 and the coaxial line 20.

The control unit 16 of the present invention further comprises a keyboard 32 and monitor 34 which are adapted to be mounted into a first lid 36 of the first transportation container 24 and can be securely fastened to the top of the transportation container 24 during use. In the preferred embodiment, the monitor 34 is a flat panel LCD graphics display.

The interface panel 28 is located in the front of the first container 24, thereby simplifying cable routing and service loops and further facilitating operator access. The interface panel 28 includes a plurality of ports 38,40 adapted to receive cables 18,20 for electrically communicating the control unit 16 with a plurality of missile stations 12 and the aircraft radar trap 22. To this end, in the preferred embodiment, the interface panel 28 includes seven (7) umbilical ports 38 and three (3) coaxial ports 40. The last six (6) umbilical ports 38 are adapted to receive umbilical cabling 18 in order to communicate the apparatus 10 of the present invention with up to six (6) missile stations 12. It will be appreciated by those skilled in the art that the present invention is readily adaptable to accommodate testing of any number of missile stations 12. The first umbilical port 38 is adapted to receive a testing cable (not shown) designed to wrap around with one of the other umbilical ports 38 during self-test, as described below.

Figure 3:
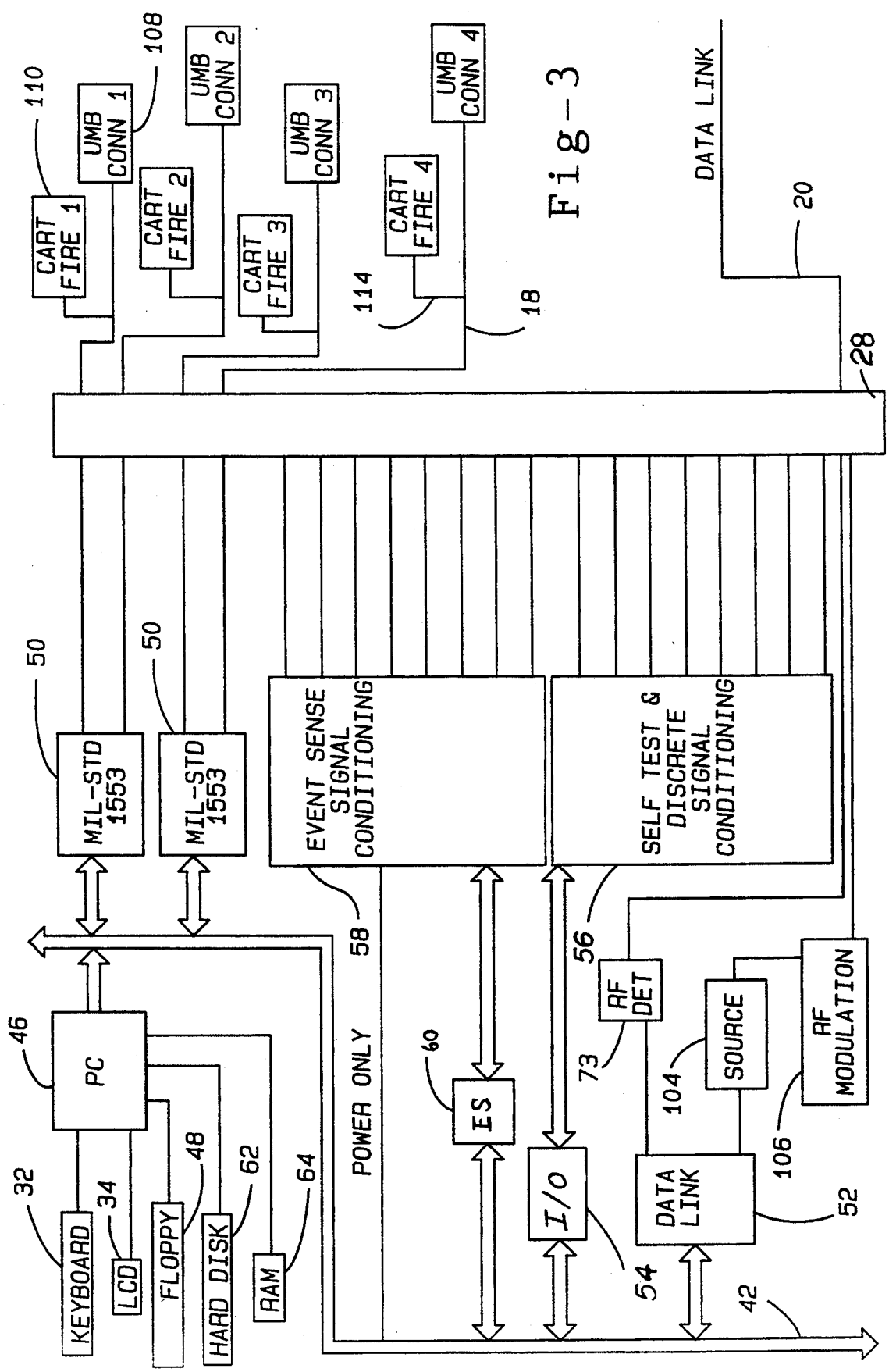
FIG. 3 is a block diagram illustrating the major components included within the apparatus shown in FIG. 1.

Referring additionally to FIG. 3, the VXI mainframe 30 of the apparatus 10 of the present invention includes a card cage adapted to receive plug-in cards based on a VXI data bus 42. In the preferred embodiment, the mainframe includes 13 slots numbered slot #0 through slot #12. A protective card cover 44, shown in FIG. 2, is provided for the VXI cards and cabling and covers slot #2 through slot #12.

To provide means for processing data received from the missile stations 12, the control unit 16 includes a microcomputer 46 and a plurality of plug-in modules. In the exemplary embodiment illustrated, slots #0 and #1 are occupied by the microcomputer 46 and remain open for access to a floppy disk 48 and connectors to the keyboard 32 and monitor 34. As will be described in more detail immediately below, the remaining slots serve to house two (2) dual redundant Military Standard (MIL-STD) 1553 interface modules 50, a data link module 52, a digital input/output (I/O) module 54, a self-test and signal conditioning module 56, an event-sense signal conditioning module 58, and an event-sense module (ES) 60. It will be appreciated by those skilled in the art that the particular slot orientation described for the included modules is merely illustrative.

In the preferred embodiment, the microcomputer 46 is a personal computer, such as the commercially available Radisys EPC-2, and includes a built-in 100 Mb hard drive 62, a 1.44 Mb 3.5" floppy disk drive 48, and random access memory (RAM) 64.

Figure 5:
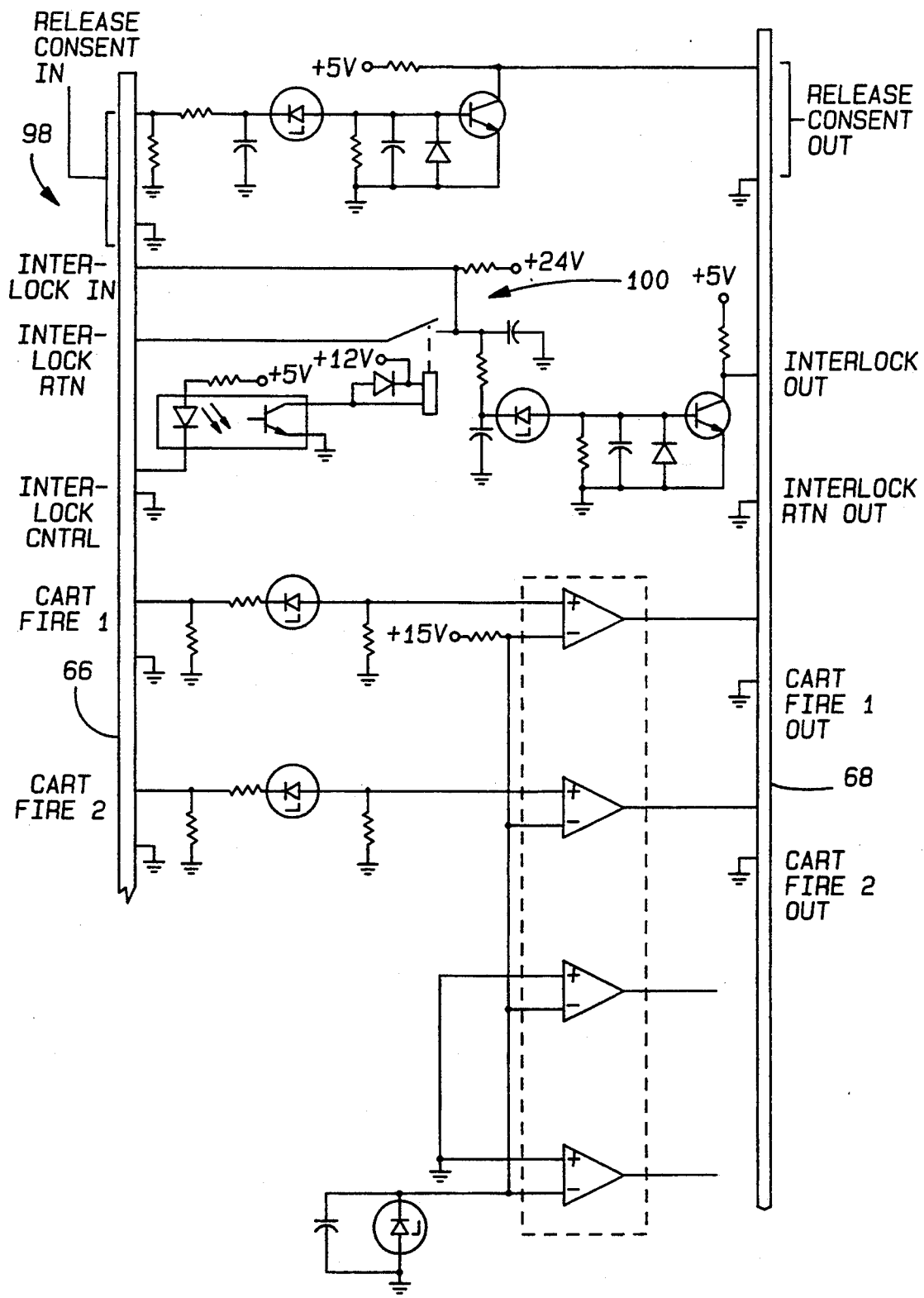
FIG. 5 is a schematic diagram of one channel of the event sense signal conditioning module of the present invention.
Figure 6A:
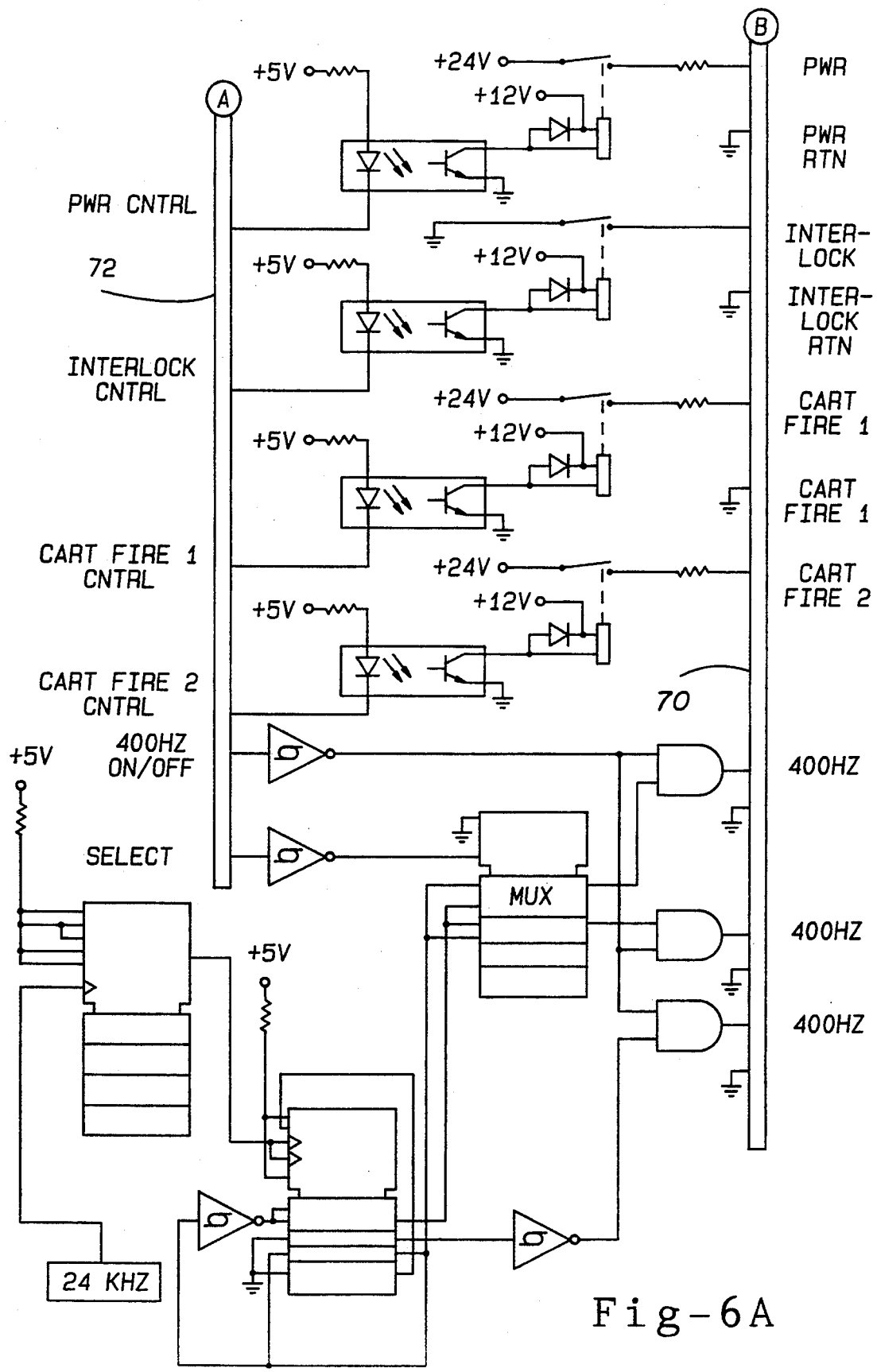
FIG. 6(A-B) is a schematic diagram of the self-test portion of the self-test and signal conditioning module.
Figure 6B:
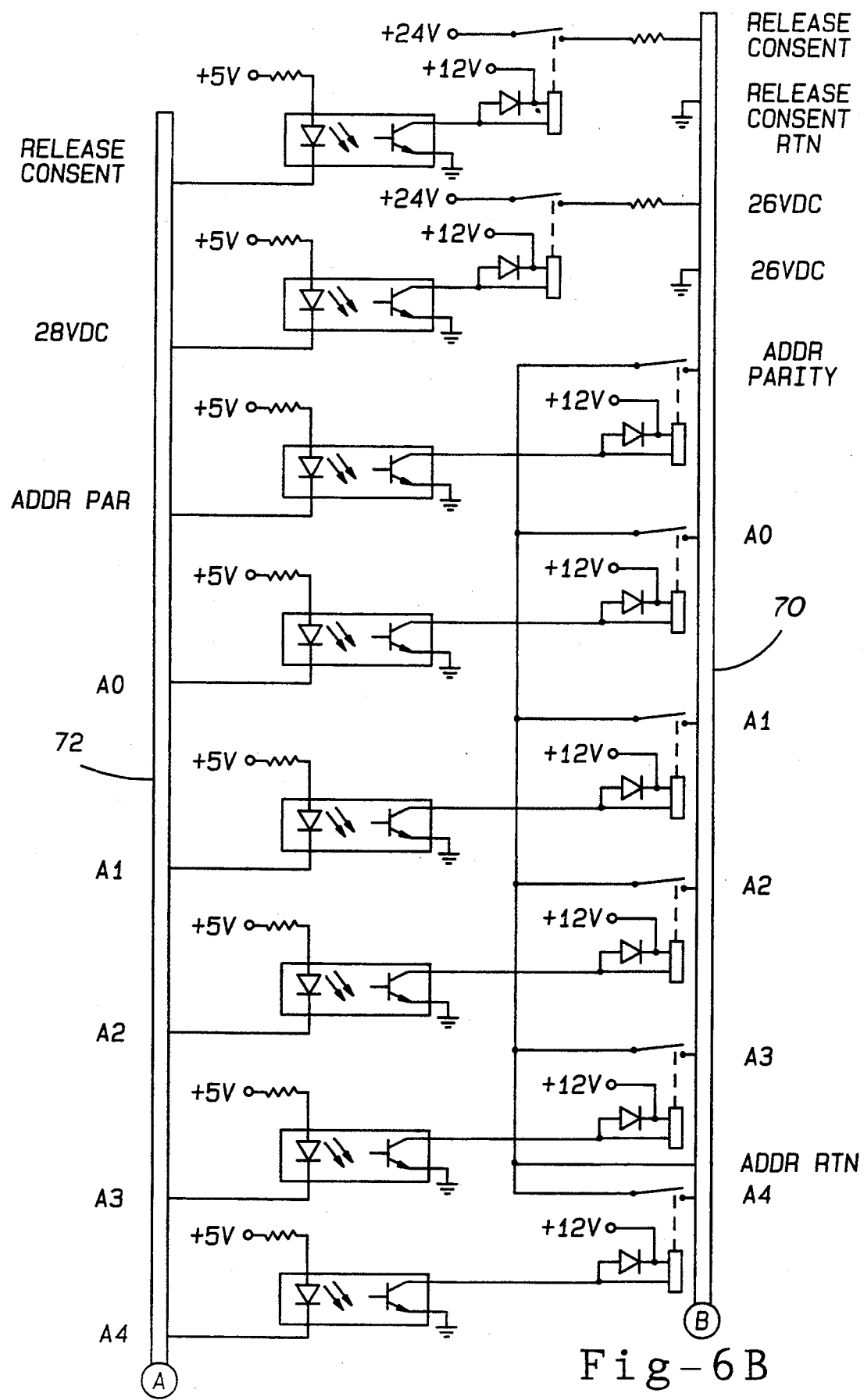
Figure 7:
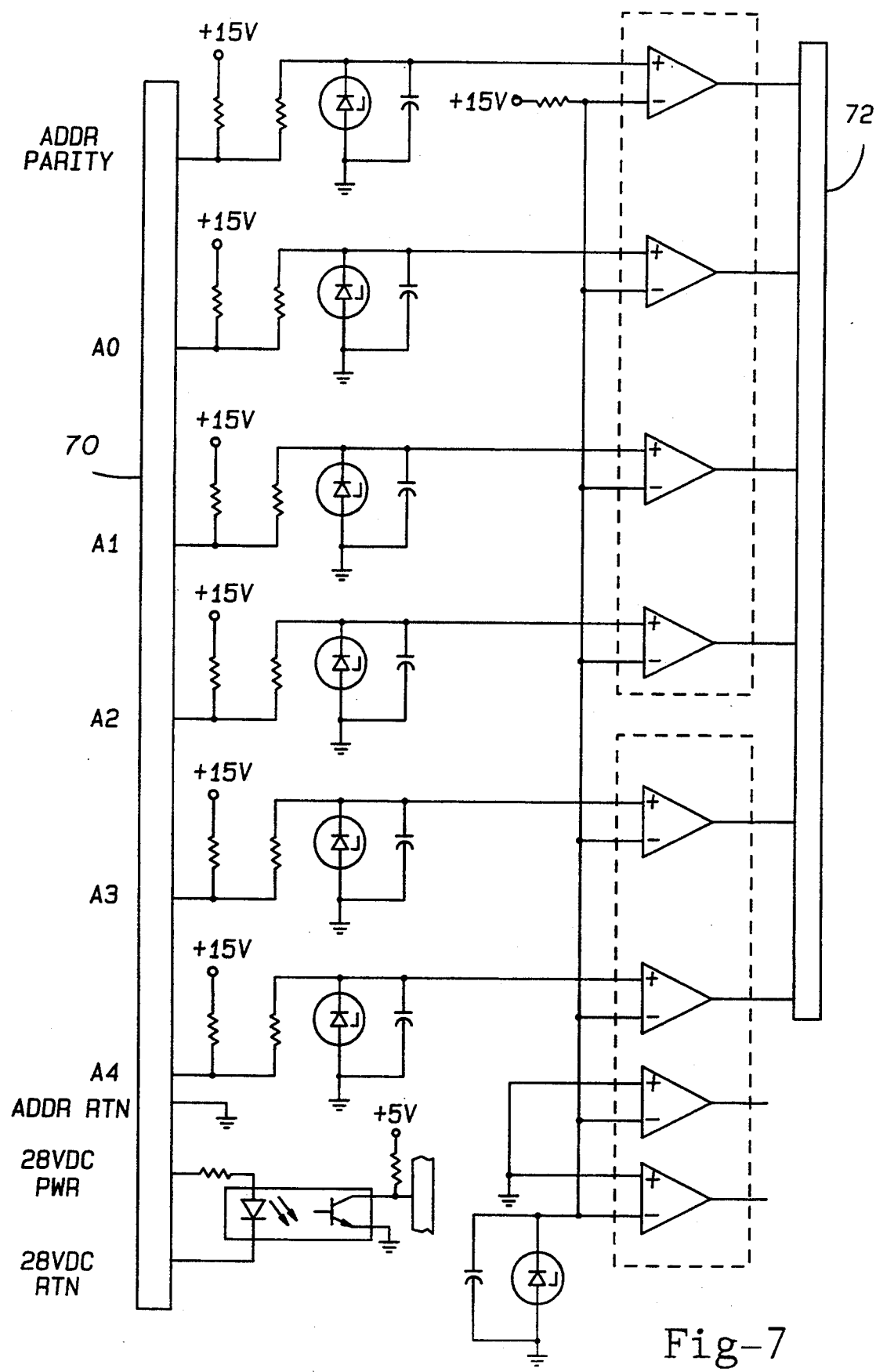
FIG. 7 is a schematic diagram of the discrete signal conditioning portion of the self-test and signal conditioning module.

In order to transmit electronic data received at the ports 38,40, at least four front panel connectors 66,68,70 and 72 are provided which are located on the plug-in modules. The front panel connectors are illustrated in FIGS. 5-7.

Figure 4:
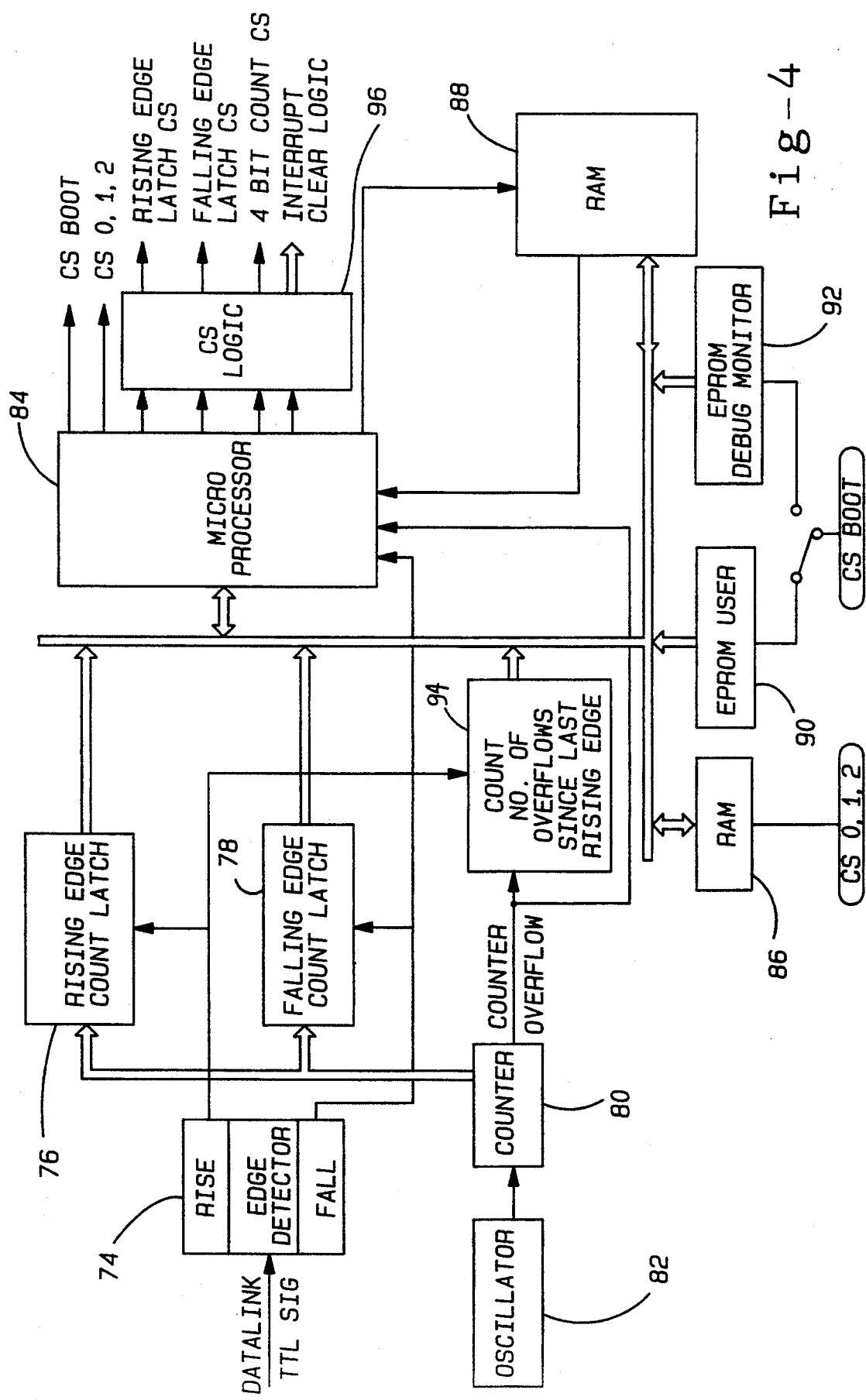
FIG. 4 is a block diagram illustrating the functions performed by the data link board of the present invention.

In slots #2 and #3, mounted is the data link module 52 which contains the data link sampling components. The data link module 52, which is shown in greater detail in FIG. 4, receives aircraft serial radar trap information transmitted from an RF detection module 73 (shown in FIG. 3) mounted in the interface panel 28.

The detector module 73 receives these signals from the coaxial cable 20 after a simulated launch and converts them into TTL level signals.

The data link module 52 serves to decode data link targeting data and to log the time a particular message was received. To this end, an edge detector circuit 74 is provided which is used to identify the rising and falling edge of each data link pulse. The output of the edge detect circuitry is used to latch the time the rising and negative edge occurred in storage registers 76 and 78, respectively. Time is provided by a 16 bit counter 80 which is clocked by a 20 MHz oscillator 82, resulting in a time resolution of 50 nsec. A second counter 94 counts the number of counter 80 overflows between the rising and falling edge of the data link pulse. This value, along with the count latched in the falling and rising edge count latches 76 and 78 is used by the microprocessor to determine the time the rising and falling edge occurred. A microprocessor 84 is provided which is interrupted upon detection of a pulse by the edge detector circuit 74. When interrupted, the latched times are read by the microprocessor 84. CS logic circuitry 96 provides address decoding to selectively enable the rising and falling edge count registers 76,78 and the second counter 94 during a microprocessor read of these registers. An analysis of the pulse width duration and time from the last pulse is performed by firmware resident in a User RAM 86 to validate and decode the incoming data link message.

The decoded message, along with a time stamp of when the message occurred, is then stored in a dual port RAM 88 for later uploading to the microcomputer 46. The firmware which is used to decode the data link message is downloaded from the microcomputer 46 to the RAM 88 during initialization of apparatus 10. This allows for easy field revisions to the firmware if future modifications become necessary. Download firmware is located in EPROM 90. EPROM 92 contains a debug monitor which enables troubleshooting of the data link board via an RS232 terminal (not shown) should a system failure occur.

The digital input/output (I/O) 54 module is mounted in slot #4. The I/O module 54 functions to generate and read converted digital signals received from the aircraft 14. The I/O module 54 further functions to generate signals which are used in level 2 self test, which will be described in further detail below. A suitable I/O module 54 is commercially available from Colorado Data Systems, Part No. 73A-412. However, it will be appreciated by those skilled in the art that any similar I/O module can be incorporated into the apparatus 10 of the present invention.

Referring to FIG. 5, one-channel 98 of the event-sense signal conditioning module 58, which occupies slots #5 and #6, is shown. The event-sense signal conditioning module 58 includes six (6) such channels corresponding in number to the six ports 38 provided in the interface panel 28 for communication with a plurality of missile stations 12. The signal conditioning module 58 receives dynamic signals from each of the six ports 38, filters these signals and converts these signals to transistor-transistor-logic (TTL) levels for input to the event-sense module 60. A relay 100 is also provided for simulation of a missile launch condition.

The signal inputs and outputs to the event-sense signal conditioning module 58 for each channel 98 are defined in Table I immediately below.

TABLE I

| Signal | Input | Output |
|---|---|---|
| Release Consent | +28 V. Pulse | TTL Pulse |
| Interlock | Open or Short Circuit | TTL, Short-TTL hi, Open-TTL low |
| Interlock Return | Intlk Return | N/A |
| Cart Fire 1 | +28 V. Pulse | TTL Pulse |
| Cart Fire 2 | +28 V. Pulse | TTL Pulse |
| Interlock Control | Open-Interlock Short-Interlock Closed | NA |

Release consent is a +28 volt signal which is generated by the aircraft 14 in conjunction with the application of 400 MHz, 3-phase power to identify the initiation of a launch cycle. The presence of release consent after application of the 400 MHz, 3-phase power source to the missile indicates that a launch cycle is to be performed. If release consent is absent upon application of the 400 MHz, 3-phase power source, then the missile executes a built-in-test (BIT) sequence only.

The interlock and interlock return signals are provided by the missile to the aircraft 14 and are used by the aircraft 14 to sense the presence of the missile. When the missile is physically connected to the launcher of the aircraft 14, the interlock and interlock return are electrically shorted. When the missile leaves the aircraft 14, the interlock and interlock return signal path is broken. Cartridge fire (cart fire) 1 and 2 are signals which the aircraft 14 sends to an eject launcher to fire an explosive charge to eject the missile away from the aircraft 14. Cart fire 1 and 2 are not present with rail launchers.

Interlock control (Interlock CTRL) is used by the apparatus 10 of the present invention to activate the interlock relay 100 located on this module 56 to simulate missile separation during a launch sequence for eject launchers.

Slot #7 houses the event-sense module 60. This module 60 serves as a time stamp of critical events. That is, the module 60 picks up signals generated by the aircraft 14 after conditioning by the event-sense signal conditioning module 58, and informs the computer 46 as to the time of the event. A suitable event-sense module is commercially available from CDS-Tektronics as Part No. VX4286.

The self-test and signal conditioning module 56 occupies slot #8 and #9. This module 56 functions to receive, filter and convert to a TTL level the signals from the aircraft missile stations 12 and feed the conditioned signals into the I/O module 54 of slot #4. These signals include Address 0-4, Address Parity and 28 Vdc Power. The 28 Vdc power signal is provided by the aircraft 14 to power a missile telemetry unit (not shown) which may be installed in selected missiles. The portion of this module 56 responsible for signal conditioning includes circuitry identical to that shown in FIG. 7 for the event-sense signal conditioning module 58.

The self-test and signal conditioning module 56 further functions to generate signals which are used to stimulate the apparatus 10 for level two self-test verification. The self-test signals are routed out of the first port 38 of the interface panel 28 and into any one of the other umbilical ports 38 corresponding to a missile station 12, through a test cable (not shown). The schematic diagram for the self-test portion of self-test and signal conditioning module 56 is shown in FIGS. 6a and 6b.

The self-test signals which are generated include release consent, interlock, cart fire 1, cart fire 2, address 0–4 (A0–A4), address parity (Addr Par), 3 phase, 400 MHz. waveform, and phase-sequence select (select). These signals are controlled by the microcomputer 46 via the digital input/output module 54.

The phase-sequence select (select) serves to verify the phase sequence. Address 0–4 informs the missile as its 1553 communication. Address parity is an error detection signal which allows the aircraft 14 to detect whether a hardware problem exists.

Two (2) dual redundant Military Standard (MILSTD) 1553 interface modules 50 occupy slots Nos. 10 and 11. These modules 50 will be used to transmit and receive all 1553 traffic from each of the missile stations 12. It will be appreciated, that while the exemplary embodiment is described with reference to four (4) interface modules 50, the control unit 16 can be readily adapted to receive additional interface modules 50, should it be desired to sequentially test more than four (4) missile stations 12. In the event that any of the 1553 modules 50 are inoperable, testing can continue on the remaining missile stations 12. In addition, these modules 50 can be software configured so that one pair can act as transmitters and the other as receivers and then the modules wrapped back to each other for self test. Such a dual redundant 1553 interface module 50 is commercially available from Excalibur Systems Inc., Part No. EXC 1553VXI/EZC.

Slot #13 in the illustrated embodiment of the present invention is vacant and provides the apparatus 10 flexibility to be modified. For example, the present invention can be adapted to test six (6) missile stations 12 by providing a third dual redundant 1553 interface module 50.

The apparatus 10 of the present invention is capable of two levels of self test. The first level will be run on all power ups and perform the built-in test (BIT) routine within each commercially available 1553 module 50. This first level requires no physical modifications to be made to the system. The confidence level for the first level self test is approximately 80%.

The second level of self test requires the operator to hook-up the self test cable (not shown) to each of the umbilical ports 38 and coaxial ports 40. This is a more time consuming process than that of the first level self test and is designed to be run on a less frequent basis, or during trouble shooting of the apparatus 10. This second level of self test will contain all BIT power up functions from level 1, as well as additional wrap around tests of umbilical signals and of data link RF functions. In this regard, the 1553 interface modules 50 are software configured so that one pair can operate as transmitters and the other as receivers and then the modules wrapped back to each other for self test.

The data link RF functions for the second level self test are simulated by a conventional source module 104 and a conventional RF modulation module 106, both of which are located in the interface panel 28. The confidence level of the second level self test is approximately 95%.

The apparatus 10 of the present invention is designed for testing of both rail launchers and eject launchers. Each missile station 12 includes a launcher umbilical connector 108 (see FIGS. 3 and 8). As will be discussed further below, each eject launcher includes a cartridge firing breech (Cart Fire) 110.

The software of the present invention is designed to facilitate ease-of-use by flight line personnel. A launch profile editor (not shown) is provided for creating simulated missile conditions and loading them into the system. The test results from the simulated missile conditions will be stored to the floppy disk 48 for subsequent analysis. These results will also be available for review by scrolling through the display on the computer LCD 34. In the preferred embodiment, the software environment will consist of DOS with Microsoft Windows. However, it will be appreciated by those skilled in the art, that the software need only be capable of simulating the operational status monitoring and command signals which are normally provided by the aircraft computer during mission performance and monitor the response to the same.

In the preferred embodiment of the present invention, four (4) umbilical cables 18 are provided, which are 25 feet in length. The umbilical cables 18 serve to electrically communicate the missile stations 12 of the aircraft 14 with the control unit 16. To this end, each umbilical cable 18 terminates with an electrical connector 112 (see FIG. 8) for interface to a missile station 12. In the preferred embodiment, the electrical connector 112 is a HI-REL connector, part No. 654476. Each umbilical cable 18 includes a branch 114 (see FIG. 2) adapted to attach to the cartridge firing breeches 110 of the eject launchers (not shown).

Figure 8:
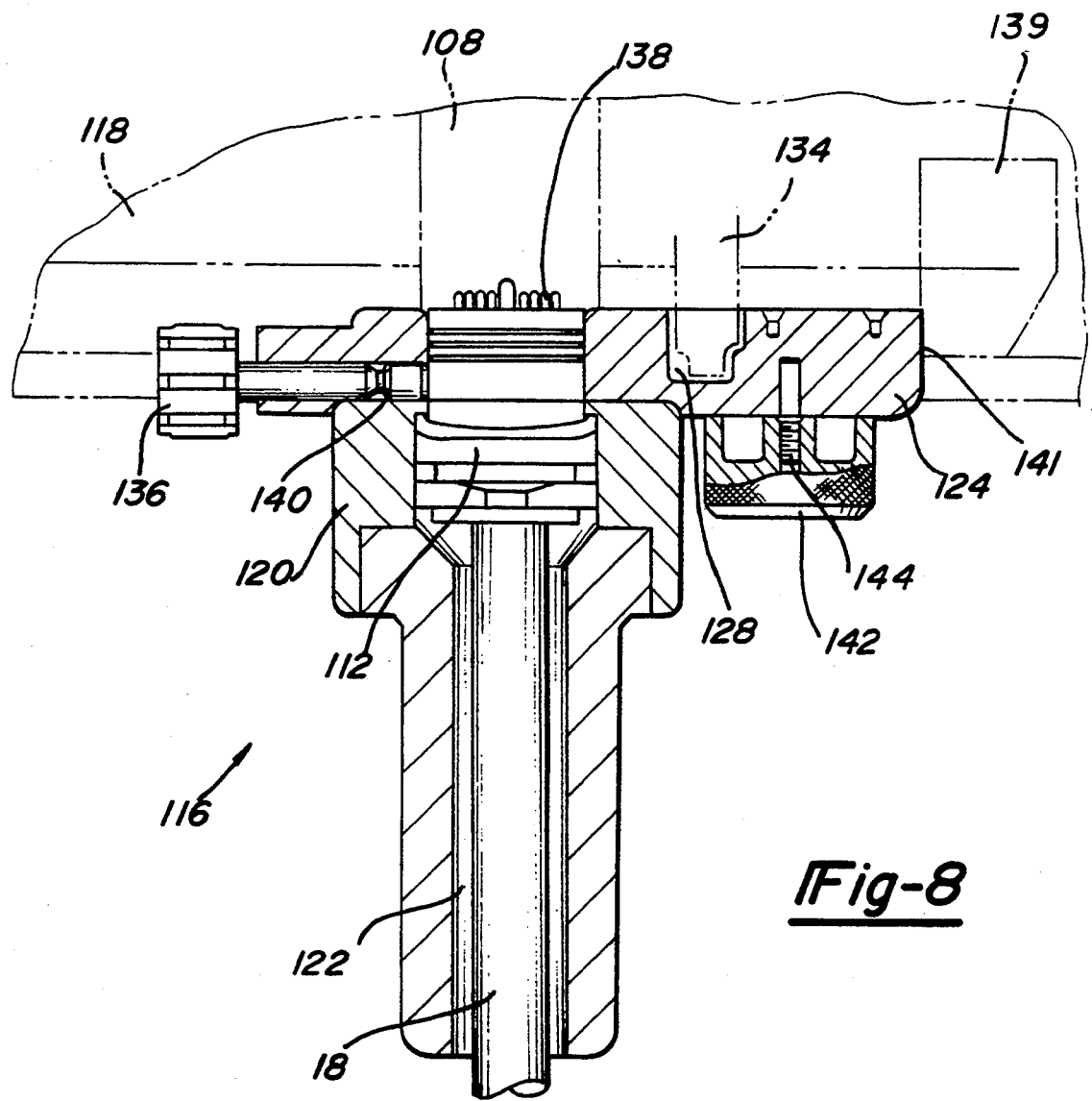
FIG. 8 is a front partial-sectional view of an electrical connector and fixture assembly made in accordance with the preferred embodiment of the present invention shown in operative connection with a rail launcher (shown in phantom)
Figure 9:
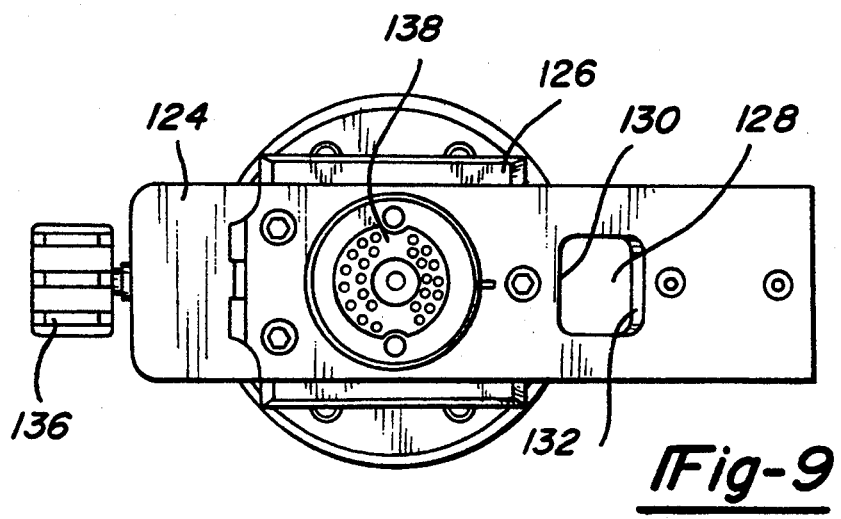
FIG. 9 is a top view of the electrical connector and fixture assembly of FIG. 8.

To provide means for detachably coupling the umbilical cables 18 to the missile stations 20, the present invention further comprises a fixture assembly 116. Turning next to FIGS. 8 and 9, illustrated is the fixture assembly. While the fixture assembly 116 is applicable to a wide range of different applications, it is specifically designed to mate with Hughes Aircraft modular rail launcher 118 (shown in phantom), part Nos. LAU-127, LAU-128 and LAU-129, as well as eject launchers, part No. LAU-106. The fixture assembly 116 is adapted to receive and retain a first end of the umbilical cable 18.

To this end, the fixture assembly 116 includes a main body portion 120 having a passage 122 through which the umbilical cable 18 is allowed to pass. The fixture assembly 116 further includes an upper portion 124 adapted to mate with the rail launcher 118. The upper portion 124 includes a pair of laterally spaced shoulder-like portions 126, a cavity 128 having first and second sides 130, 132 and a front edge 141. The cavity 128 is adapted to receive an aft detent 134 of a rail launcher 118. At one end of the upper portion 124, a buffer connector clamping screw 136 is provided which passes through a bore in the upper portion 124 and serves to mechanically secure the fixture assembly 116 to retain a buffer connector 138 in electrical communication with the launcher umbilical connector 108 when the screw 136 is tightened.

Each aircraft rail launcher 118 is prepared for testing by installing the umbilical buffer connector 138 to the extended launcher umbilical connector 108. In the preferred embodiment, the umbilical buffer connector 138 is a HI-REL buffer, part No. 44095-30P. The umbilical connector 112 is then retracted. The test operator prepares the fixture assembly 116 for testing on the rail launcher 118 by verifying that the buffer clamping screw 136 is retracted.

Next, the test operator positions the fixture assembly 116 into a cavity (not shown) on the rail launcher 118 and slides the shoulder-like portions 126 through a channel (not shown) until a forward detent 139 on the rail launcher 118 makes contact with the fixture's front edge 141. The operator then inserts the aft detent 134 into the cavity 128. The engagement of the aft detent 134 with the first side 132 of the cavity 128 ensures proper alignment of the connectors 108,112 prior to engagement. Verification of the mechanical dimensions and placement of the aft detent 134 of the rail launcher 118 is accomplished through engagement of the aft detent 134 with the cavity 128.

The test operator will then engage the launcher umbilical connector 108, causing electrical connection of the launcher umbilical connector 108 with the umbilical cable 18. Successful engagement of the launcher umbilical connector 108 into the connector 112 verifies that the dimensions and placement of the launcher umbilical connector 108 are correct relative to the detents 134,139.

During testing of the launch cycle on a rail launcher 118, the aircraft 14 and the control unit 16 of the apparatus 10 of the present invention will actually simulate a launch separation. In this regard, the aircraft 14 will retract the launcher umbilical connector 108, breaking the electrical connection between the missile station 12 and the apparatus 10. Despite this separation, the fixture assembly 116 mechanically retains the umbilical cable 18 onto the aircraft rail launcher 118, thereby eliminating the need to mechanically reattach the umbilical cable 18 for subsequent test runs. Electrical reconnection is made by reengaging the connectors 108,112.

The eject launchers of the aircraft 14 are similarly prepared by installing an umbilical buffer connector 138 to the extended launcher umbilical connector (not shown). The test operator connects the fixture assembly 116 to the eject launcher's umbilical buffer connector and tightens the buffer clamping screw 136 until it "clicks". The buffer clamping screw 136 has a nylon tip 140 that clamps the fixture assembly 116 and umbilical cable 18 onto the eject launcher's umbilical buffer connector 138. Heretobefore, an additional operator was required to physically hold the umbilical cable 18 in place, or tape was used in an attempt to hold the cable 18 on the aircraft 14.

In the preferred embodiment, the clamping screw 136 utilizes an adjustable torque screw which translates a repeatable maximum torque into a repeatable maximum clamping force on the buffer connector 138. This torque is set to be sufficient to hold the weight of the fixture assembly 116 and cable 18 without causing damage to the buffer connector 138. Importantly, this clamping force is set sufficiently to allow the umbilical cable 18 and fixture assembly 116 to separate from the eject launcher without damaging the launcher's connector or the aircraft 14 in the event that the umbilical cable 18 is snagged or inadvertently pulled away from the aircraft 14.

During transportation and storage of the umbilical cable 18 and fixture assembly 116, the buffer connector 138 can be secured and protected by a buffer cover 142. The buffer cover 142 is made of nylon and screws directly to a threaded stud (not shown) on the buffer connector 138 and protects the delicate electrical contacts of the buffer connector 138. The buffer connector 138 is stored in the functional position by tightening the clamping screw 136 with the buffer cover 142 installed. The buffer cover 142 can be tethered to the main body portion 120 with a lanyard (not shown). When the buffer cover 142 is not in use, the optional buffer cover 142 can be stored as illustrated in FIG. 8. In this regard, the buffer cover 142 is secured to a threaded stud 144 disposed underneath the upper portion 124.

The foregoing discussion describes merely exemplary embodiments of the present invention. One skilled in the art will readily recognize from such discussion, and from the accompanying drawings and claims, that various changes, modifications and variations can be made therein without departing from the spirit and scope of the invention as defined in the following claims. For example, the present invention is readily adaptable to accommodate sequential testing of any particular number of missile stations.

What is claimed is:

1. An apparatus for testing an aircraft launcher system of the type including a plurality of missile stations and a radar trap for receiving a radio frequency signal, the apparatus comprising:

a portable control unit having an overall size capable of being transported to an aircraft, the control unit including a plurality of data ports;

a plurality of missile umbilical cables, each of the plurality of missile umbilical cables including a first end having a first electrical connector adapted to electrically attach to one of the data ports and a second end having a second electrical connector adapted to electrically attach to one of the plurality of missile stations;

processing means mounted in the control unit for receiving and processing data from the plurality of missile stations including a first signal generated by the aircraft;

simulation means mounted in the control unit for simulating signals that ordinarily would be provided if actual missiles were present at the missile stations in response to the first signal generated by the aircraft;

a radar umbilical cable including a first end having a first electrical connector adapted to electrically attach to one of the data ports and a second end having a second electrical connector adapted to electrically attach to the radar trap; and means for receiving a post-launch information signal from the radar trap, the means for receiving being mounted in the control unit and coupled to one of the data ports.

2. The apparatus of claim 1, wherein the means for receiving a second signal further comprises means for determining a time of receipt of the second signal.

3. The apparatus of claim 1, further comprising a test cable and means for generating a self test of the apparatus, the means for generating the self test adapted to communicate with the processing means through the test cable.

4. The apparatus of claim 1, wherein the simulation means is adapted to simulate a preselected sequence of missile signals in response to the first signal generated by the aircraft.

5. The apparatus of claim 4, wherein the simulation means is adapted to simulate a preselected sequence of missile signals corresponding to an AMRAAM response sequence.

6. The apparatus of claim 1, further comprising event sensing means for receiving and recording a time of receipt of a plurality of signals generated by the aircraft.

7. An apparatus for testing an aircraft launcher system of the type including a plurality of missile stations, a radar trap for receiving a radio frequency signal, and a missile interface, the apparatus comprising:

a control unit having an overall size capable of being transported to an aircraft, the control unit including an interface panel having a plurality of data ports, and a microcomputer;

a plurality of missile umbilical cables corresponding in number to the plurality of missiles stations, each of the plurality of missile umbilical cables including a first end having a first electrical connector adapted to electrically attach to one of the data ports and a second end having a second electrical connector adapted to electrically attach to one of the plurality of missile stations;

at least two interface modules mounted in the control unit, a first and second interface module being connected to a first and second data port, respectively; the interface modules each being adapted to simulate signals that would ordinarily be provided if actual missiles were present at the missile stations in response to a first signal generated by the aircraft;

a radar umbilical cable including a first end having a first electrical connector adapted to electrically attach to one of the data ports and a second end having a second electrical connector adapted to electrically attach to the radar trap; and a data link module mounted in the control unit and coupled to one of the data ports adapted to receive a post-launch information signal from the radar trap.

8. The apparatus of claim 7, wherein the data link module further includes an edge detection circuitry for determining a time of receipt of the second signal.

9. The apparatus of claim 7, wherein the apparatus includes at least four interface modules.

10. The apparatus of claim 9, wherein the interface modules are each adapted to simulate a preselected sequence of missile signals corresponding to an AM-RAAM response sequence.

11. The apparatus of claim 7, further comprising an event sense module adapted to receive a plurality of signals from the aircraft and record a time of receipt of each of the plurality of signals from the aircraft.

12. An apparatus for testing an aircraft launcher system of the type including a plurality of missile stations, a radar trap for receiving a radio frequency signal, and a missile interface, the apparatus comprising:

a control unit having an overall size capable of being transported to an aircraft, the control unit including an interface panel having a plurality of data ports, and a microcomputer;

a plurality of missile umbilical cables corresponding in number to the plurality of missiles stations, each of the plurality of missile umbilical cables including a first end having a first electrical connector adapted to electrically attach to one of the data ports and a second end having a second electrical connector adapted to electrically attach to one of the plurality of missile stations;

at least two interface modules mounted in the control unit, a first and second interface module being connected to a first and second data port, respectively, the interface modules each being adapted to simulate signals that would ordinarily be provided if actual missiles were present at the missile stations in response to a first signal generated by the aircraft;

a radar umbilical cable including a first end having a first electrical connector adapted to electrically attach to one of the data ports and a second end having a second electrical connector adapted to electrically attach to the radar trap, said radar umbilical cable being operative to transmit a post-launch signal received by said aircraft to said control unit;

a data link module mounted in the control unit and coupled to one of the data ports adapted to receive a second signal from the radar trap, the data link module including an edge detection circuitry for determining a time of receipt of the second signal; and an event sense module adapted to receive a plurality of signals from the aircraft and record a time of receipt of each of the plurality of signals from the aircraft.

* * * * *